US006693452B1

(12) United States Patent
Ansari et al.

(10) Patent No.: US 6,693,452 B1
(45) Date of Patent: Feb. 17, 2004

(54) FLOOR PLANNING FOR PROGRAMMABLE GATE ARRAY HAVING EMBEDDED FIXED LOGIC CIRCUITRY

(75) Inventors: Ahmad R. Ansari, San Jose, CA (US); Stephen M. Douglass, Saratoga, CA (US)

(73) Assignee: Xilinx, Inc., San Jose, CA (US)

( * ) Notice: Subject to any disclaimer, the term of this patent is extended or adjusted under 35 U.S.C. 154(b) by 39 days.

(21) Appl. No.: 10/082,883

(22) Filed: Feb. 25, 2002

(51) Int. Cl.$^7$ ............................................. H03K 19/177
(52) U.S. Cl. ............................................. 326/38; 326/39
(58) Field of Search ...................................... 326/37–41

(56) References Cited

U.S. PATENT DOCUMENTS

| | | | |
|---|---|---|---|
| 5,361,373 A | | 11/1994 | Gilson |
| 5,473,267 A | * | 12/1995 | Stansfield .................... 326/41 |
| 5,537,601 A | | 7/1996 | Kimura et al. |
| 5,652,904 A | | 7/1997 | Trimberger |
| 5,671,355 A | | 9/1997 | Collins |
| 5,752,035 A | | 5/1998 | Trimberger |
| 5,835,405 A | | 11/1998 | Tsui et al. |
| 5,970,254 A | | 10/1999 | Cooke et al. |
| 6,020,755 A | | 2/2000 | Andrews et al. |
| 6,026,481 A | | 2/2000 | New et al. |
| 6,096,091 A | | 8/2000 | Hartmann |
| 6,154,051 A | | 11/2000 | Nguyen et al. |
| 6,181,163 B1 | | 1/2001 | Agrawal et al. |
| 6,242,945 B1 | * | 6/2001 | New ........................... 326/39 |
| 6,279,045 B1 | | 8/2001 | Muthujumaraswathy et al. |
| 6,282,627 B1 | | 8/2001 | Wong et al. |
| 6,343,207 B1 | | 1/2002 | Hessel et al. |
| 6,353,331 B1 | * | 3/2002 | Shimanek .................... 326/39 |
| 6,522,167 B1 | | 2/2003 | Ansari et al. |
| 6,541,991 B1 | | 4/2003 | Hornchek, deceased et al. |
| 2003/0062922 A1 | * | 4/2003 | Douglass et al. ............ 326/39 |

FOREIGN PATENT DOCUMENTS

EP          0 905 906 A2    3/1999

OTHER PUBLICATIONS

Cary D. Snyder and Max Baron; "Xilinx's A–to–Z System Platform"; Cahners Microprocessor; The Insider's Guide to Microprocessor Hardware; Microdesign Resources; Feb. 6, 2001; pp. 1–5.
U.S. patent application Ser. No. 09/858,732, Schultz, filed May. 15, 2001.
U.S. patent application Ser. No. 09/861,112, Dao et al., filed May. 18, 2001.
U.S. patent application Ser. No. 09/917,304, Douglass et al., filed Jul. 27, 2001.
U.S. patent application Ser. No. 09/968,446, Douglass, filed Sep. 28 2001.
U.S. patent application Ser. No. 09/991,410, Herron et al., filed Nov. 16, 2001.
U.S. patent application Ser. No. 09/991,412, Herron et al., filed Nov. 16, 2001.
U.S. patent application Ser. No. 10/001,871, Douglass et al., filed Nov. 19, 2001.
U.S. patent application Ser. No. 10/043,769, Schultz, filed Jan. 1, 2002.

* cited by examiner

*Primary Examiner*—Don Le
(74) *Attorney, Agent, or Firm*—Garlick Harrison; H. C. Chan; Kim Kanzaki

(57) ABSTRACT

Interconnecting logic provides connectivity of an embedded fixed logic circuit, or circuits, with programmable logic fabric of a programmable gate array such that the fixed logic circuit functions as an extension of the programmable logic fabric. The interconnecting logic includes interconnecting tiles and may further include interconnecting logic. The interconnecting tiles provide selective connectivity between inputs and/or outputs of the fixed logic circuit and the interconnects of the programmable logic fabric. The interconnecting logic, when included, provides logic circuitry that conditions data transfers between the fixed logic circuit and the programmable logic fabric. The invention is directed towards the various needs and requirements of the layout and floor planning of a device having both fixed logic circuitry and programmable logic circuitry. The various designs are geared towards many goals including allowing fail-safe operation, facilitating the ease of interface between fixed logic circuitry and programmable logic fabric, among other issues.

43 Claims, 9 Drawing Sheets

FLOOR PLANNING FOR PROGRAMMABLE GATE ARRAY HAVING EMBEDDED FIXED LOGIC CIRCUITRY

BACKGROUND

Technical Field

The invention relates generally to the design of integrated circuits; and, more particularly, it relates to the design of integrated circuits having both fixed logic and programmable logic components.

Related Art

Programmable devices are a class of general-purpose integrated circuits that can be configured for a wide variety of applications. Such programmable devices have two basic versions, mask programmable devices, which are programmed only by the manufacturer, and field programmable devices, which are programmable by the end user. In addition, programmable devices can be further categorized as programmable memory devices or programmable logic devices. Programmable memory devices include programmable read only memory (PROM), erasable programmable read only memory (EPROM) and electronically erasable programmable read only memory (EEPROM). Programmable logic devices include programmable logic array (PLA) devices, programmable array logic (PAL) devices, erasable programmable logic devices (EPLD) devices, and programmable gate arrays (PGA). Field programmable gate arrays (programmable gate array) have become very popular for telecommunication applications, Internet applications, switching applications, routing applications, et cetera.

As is known, programmable gate arrays offer the end user the benefits of custom CMOS VLSI integrated circuits while avoiding the initial cost, design time delay, and inherent risk of Application Specific Integrated Circuits (ASIC). While programmable gate arrays have these advantages, there are some disadvantages. For instance, a programmable gate array programmed to perform a similar function as implemented in an ASIC requires approximately 25 to 50 times more die area than the ASIC. As such, the manufacturing expense of a programmable gate array is greater than that of an ASIC. In addition, a programmable gate array requires significantly more printed circuit board space and consumes more power than an equally functional ASIC. Furthermore, programmable gate arrays are designed to target various implementations and usually do not deliver the performance of the ASICs.

To mitigate some of the disadvantages of programmable gate arrays with respect to ASICS, some programmable gate array manufacturers include ASIC like functions on the same substrate as the programmable logic fabric. For example, programmable gate arrays are now commercially available that include random access memory (RAM) blocks and/or multipliers in the programmable logic fabric. As such, the programmable logic fabric does not have to be programmed to perform RAM functions and/or multiplier functions, when such functions are needed. Thus, for these functions, significantly less die area is needed within the programmable gate array.

While including fixed logic circuits in the programmable gate array fabric offers end users greater programming options with less die area consumption, end users are now demanding greater performance and flexibility from programmable gate arrays. In particular, end users would like to see more fixed logic functionality, (i.e., ASIC like functionality) embedded within the programmable logic fabric of programmable gate arrays, while retaining the versatility of traditional programmable gate arrays. Within embodiments of programmable gate arrays having embedded fixed logic circuitry, given the relative newness of this particular area of art, there is little or no teaching that is directed towards the manner in which the various components of the fixed logic circuits and the programmable circuitry should be laid out within a design.

Further limitations and disadvantages of the manner in which such circuitry is laid out will become apparent to one of skill in the art through comparison of such systems with the invention as set forth in the remainder of the present application with reference to the drawings.

SUMMARY OF THE INVENTION

In order to overcome these shortcomings, as well as other shortcomings of the prior art devices, an integrated circuit designed and constructed according to the present invention includes a number of configurable logic blocks arranged into a fabric such that the fabric has an opening therein that is surrounded by configurable logic blocks. Formed within the opening in the fabric is a fixed logic circuit that includes a number of input/output lines and control lines. Surrounding the fixed logic circuit within the opening is interconnecting logic that interfaces the input/output lines and the control lines of the fixed logic circuit to the fabric. According to the present invention, this interconnecting logic distributes the input/output and control lines along a number of configurable logic blocks bordering the opening. The interconnecting logic may include interconnecting tiles that interface directly to the configurable logic blocks of the fabric.

In some embodiments, the input/output lines and control lines of the fixed logic circuit include hundreds of individual lines. However, the opening is bordered by far fewer that this number of configurable logic blocks. Thus, in such case, each of a number of configurable logic blocks bordering the opening services a plurality of address lines, a plurality of data lines, and a plurality of control lines. The interconnecting tiles of the interconnecting logic each terminate a set of address lines, data lines, and control lines of the fixed logic circuit and thus interface the signals to the configurable logic blocks that border the opening.

According to one aspect of the present invention, a group of the lines supporting the fixed logic circuit, e.g., data, address, and control lines of a processor bus, are distributed along a number of interconnecting tiles bordering a first side of the opening. In such embodiments, other lines of the processor are distributed along interconnecting tiles bordering other sides of the opening. Such distribution of the signal lines of the fixed logic circuit allows the fabric to be managed so that differing portions of the fabric are configured to perform differing functions, such functions corresponding to the locally presented inputs/outputs of the fixed logic circuit.

When multiple fixed logic circuits are present, symmetry in the presentation of input/output, control, etc. lines of the fixed logic circuit to the fabric may be employed. For example, in an implementation that includes multiple fixed logic processing cores, symmetry may be employed in the presentation of lines to the fabric about a central portion of the fabric. Such symmetry in presentation of lines to the fabric provides efficiencies in fabric configuration both in cooperative and stand-alone configurations of multiple fixed logic circuit implementations.

Other aspects, advantages and novel features of the invention will become apparent from the following detailed description of the invention when considered in conjunction with the accompanying drawings.

BRIEF DESCRIPTION OF THE DRAWINGS

A better understanding of the invention can be obtained when the following detailed description of various exemplary embodiments is considered in conjunction with the following drawings.

DETAILED DESCRIPTION OF THE DRAWINGS

Generally, an integrated circuit constructed according to the present invention includes at least one fixed logic circuit residing within an opening formed in a programmable gate array fabric. Interconnecting logic interfaces the embedded fixed logic circuit, or circuits, with the programmable logic fabric of the programmable gate array. The interconnecting logic enables any fixed logic circuit (e.g., a digital signal processor, microprocessor, physical layer interface, link layer interface, network layer interface, audio processor, video graphics processor, and/or applications specific integrated circuit) to be embedded within the programmable logic fabric of the programmable gate array. In addition, the interconnecting logic provides connectivity between the fixed logic circuit and the programmable logic fabric such that the fixed logic circuit functions as an extension of the programmable logic fabric.

The interconnecting logic includes interconnecting tiles, interconnections between the fixed logic circuit and the interconnecting tiles, and may include additional components. The interconnecting tiles provide selective connectivity between inputs and/or outputs of the fixed logic circuit and the interconnects (configurable logic blocks "CLBs") of the programmable logic fabric. With such interconnecting logic, any fixed logic circuit may be readily embedded within a programmable gate array to provide additional functionality to the end users of the programmable gate array.

Figure 1:
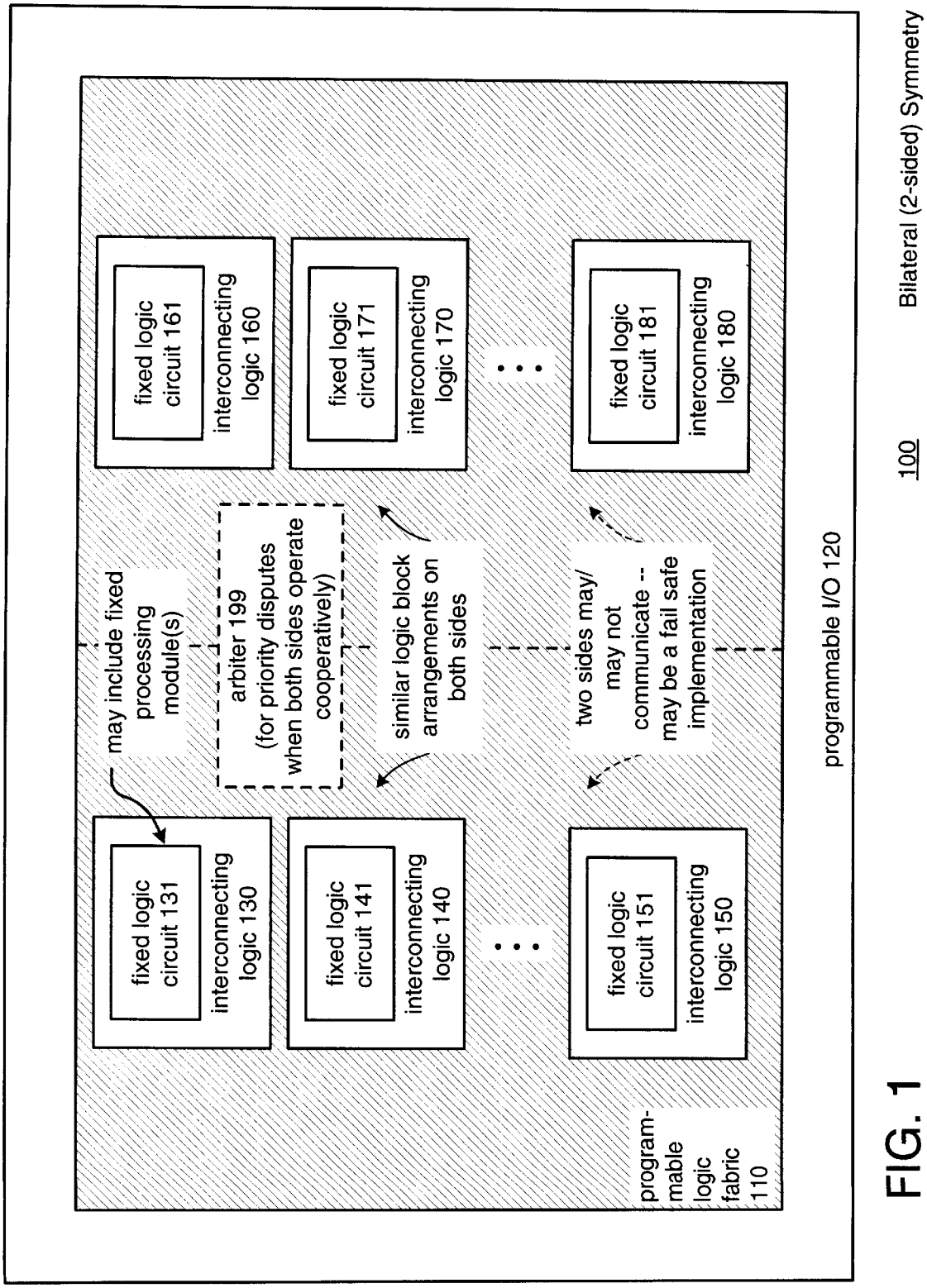
FIG. 1 is a system diagram illustrating an embodiment of an integrated circuit having bilateral symmetry that is built in accordance with the present invention.

FIG. 1 is a system diagram illustrating an embodiment of an integrated circuit 100, having bilateral symmetry that is built in accordance with the present invention. The integrated circuit 100 includes a programmable input/output circuit 120 that surrounds a programmable logic fabric 110. In addition, the integrated circuit 100 includes a number of fixed logic circuits. These fixed logic circuits, while being configurable based upon pin settings and/or software settings, do not include hardware logic that may be configured as does the programmable logic fabric 110.

On the left hand side of the programmable logic fabric 110 are a number of fixed logic circuits, shown as a fixed logic circuit 131, a fixed logic circuit 141, . . . and a fixed logic circuit 151. Similarly, on the right hand side of the programmable logic fabric 110 are a number of fixed logic circuits, shown as a fixed logic circuit 161, a fixed logic circuit 171, . . . and a fixed logic circuit 181. Each of the fixed logic circuits 131, 141, . . . , 151, 161, 171, . . . , and 181 is surrounded by interconnecting logic (130, 140, . . . , 150, 160, 170, . . . , and 180, respectively) that is used to connect the fixed logic circuits 131, 141, . . . , 151, 161, 171, . . . , and 181 to the programmable logic fabric 110.

The integrated circuit of FIG. 1 has bilateral symmetry, e.g., the two sides of the integrated circuit 100 are at least partially symmetrical about a central portion of the fabric 110. In this configuration, the integrated circuit 100 has two halves that include similar logic block arrangements and that have similar performance capabilities. The two sides of the integrated circuit 100 may even be duplicates of one another in terms of components and functionality. However, they may also differ in some ways to produce a desired benefit for a given application.

The integrated circuit 100 of FIG. 1 may include an arbiter 199 that arbitrates disputes and/or coordinates operation of the components of the two sides of the integrated circuit 100 so that the components operate cooperatively and use the shared resources in the fabric efficiently. The arbiter 199 may be instantiated as a single unit or multiple units instantiated within the programmable logic fabric 110. The arbiter 199 may be primarily embodied as hardware, software, or a combination of hardware and software.

If desired, the two sides of the integrated circuit 100 may or may not communicate with one another during normal operations. In this fashion, the two sides of the integrated circuit 100 may cooperate with one another in performing joint operations, or work independently. When the two sides of the integrated circuit 100 cooperate with one another, they may share processing tasks so that an overall operation is best performed. In one operation in which the two sides of the integrated circuit 100 work independently of one another, the two sides of the integrated circuit 100 may operate redundantly in a fail-safe manner as back-ups of one another.

Figure 2:
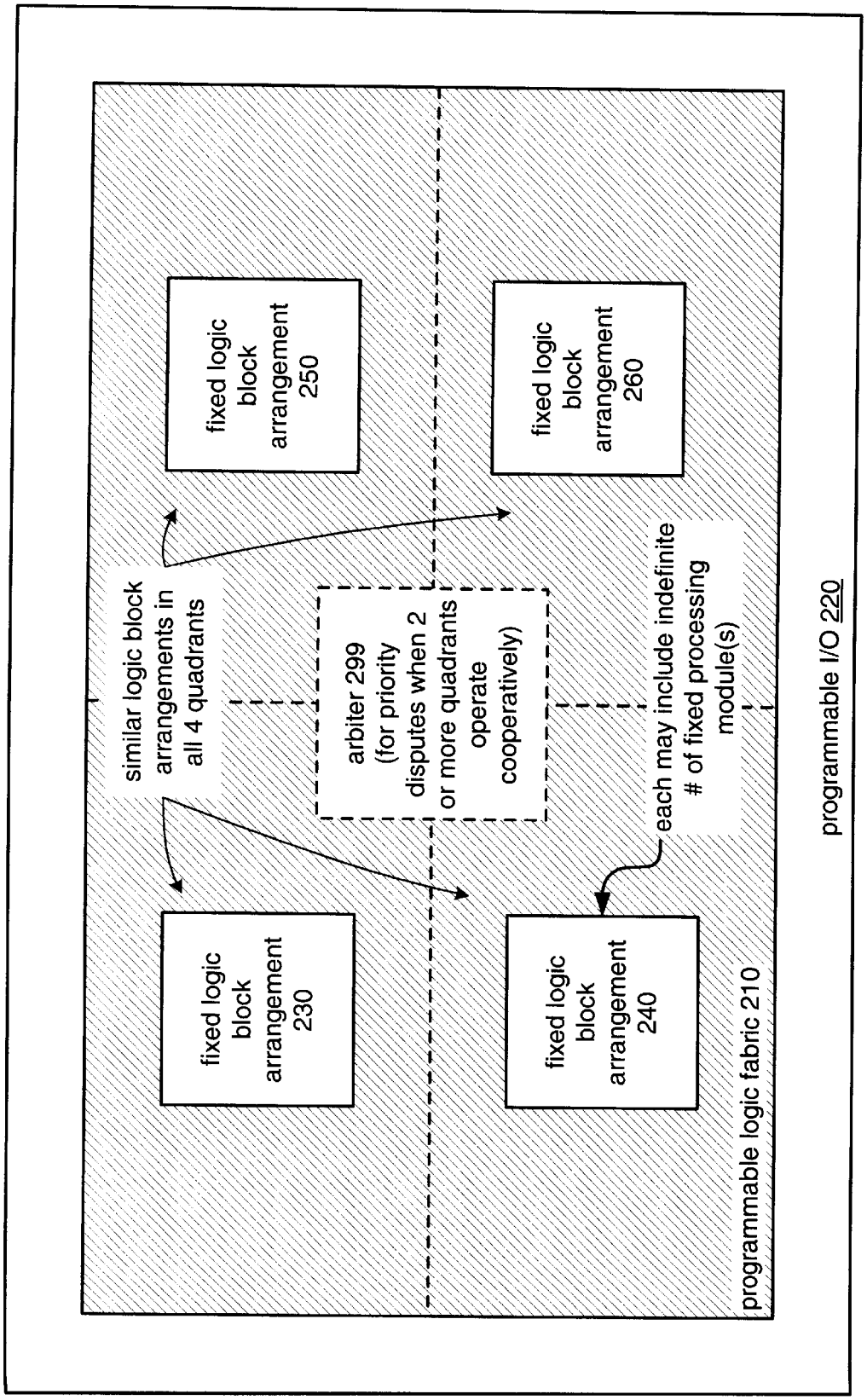
FIG. 2 is a system diagram illustrating an embodiment of an integrated circuit having 4-sided symmetry, that is built in accordance with the present invention.

FIG. 2 is a system diagram illustrating an embodiment of an integrated circuit 200 having 4-sided symmetry that is built in accordance with the present invention. The integrated circuit 200 includes a programmable input/output circuit 220 that surrounds a programmable logic fabric 210. In addition, the integrated circuit 200 includes a number of fixed logic block arrangements 230, 240, 250, and 260. Each of the fixed logic block arrangements 230, 240, 250, and 260 includes a fixed logic circuit and interconnecting logic as was previously described and as will subsequently be described with particular reference to FIGS. 3–8. Each of the fixed logic block arrangements 230, 240, 250, and 260 may include any of a plurality of fixed logic circuits performing any of a variety of operations and having a fixed logic construction. Each of the fixed logic block arrangements may be viewed as being a quantized design having fixed logic functionality. The fixed logic block arrangements 230, 240, 250, and 260 may be identical to one another, partially identical to one another, or fully different from one another.

In the upper left hand corner of the programmable logic fabric 210 resides a fixed logic block arrangement 230; in the lower left hand corner of the programmable logic fabric 210 resides a fixed logic block arrangement 240; in the upper right left hand corner of the programmable logic fabric 210 resides a fixed logic block arrangement 250; and in the lower right hand corner of the programmable logic fabric 210 resides a fixed logic block arrangement 260. FIG. 2 shows an embodiment of an integrated circuit having 4-sided symmetry. This symmetry relates to the manner in which the four portions of the fabric 210 are sized (e.g., number of CLBs in each of the four portions), the manner in which the openings are formed with respect to particular features of the fabric 210, the size of the openings (number and type of CLBs replaced by the fixed logic block arrangement), or other characteristics that may be symmetrically related.

Similar to the embodiment described in FIG. 1, if desired, the four quadrants of the integrated circuit 200 may or may not communicate with one another. In other words, some of the quadrants may be redundant back-ups of other quadrants to provide fault tolerance. The four quadrants may all include similar logic block arrangements. For example, the four quadrants may even be duplicates of one another in terms of components and functionality. However, they may also be different as desired in a given application. In addition, in alternative embodiments, an arbiter 299 may be employed to assist in priority disputes when two or more of the four quadrants within the integrated circuit 200 operate cooperatively.

Figure 3:
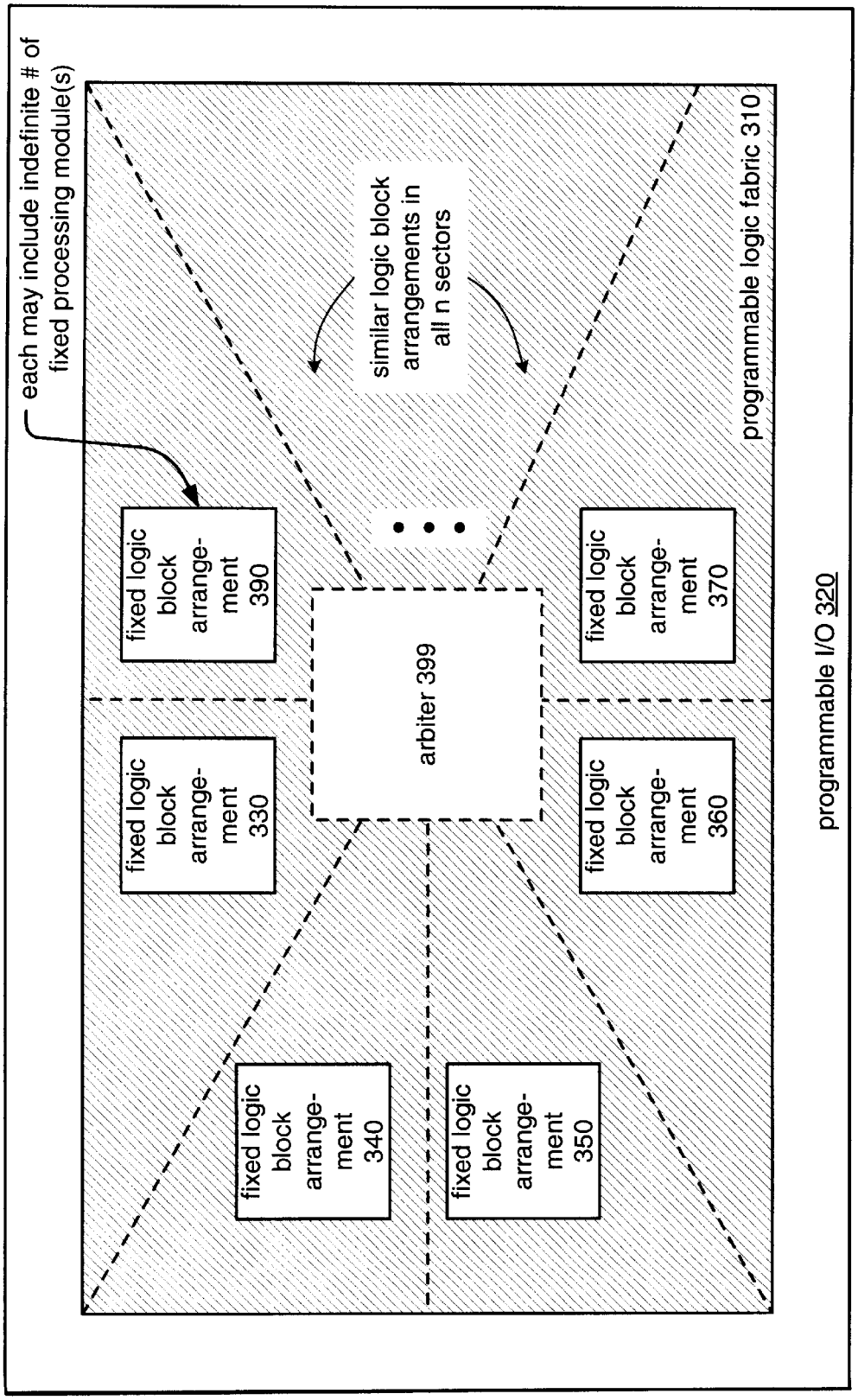
FIG. 3 is a system diagram illustrating an embodiment of an integrated circuit having n-sided symmetry that is built in accordance with the present invention.

FIG. 3 is a system diagram illustrating an embodiment of an integrated circuit 300 having n-sided symmetry that is built in accordance with the present invention. The integrated circuit 300 may be viewed as being an extension of one or both of the FIGS. 1 and 2. The integrated circuit 300 includes a programmable input/output circuit 320 that surrounds a programmable logic fabric 310. In addition, the integrated circuit 300 includes a number of fixed logic block arrangements. Each of the fixed logic block arrangements includes a fixed logic circuit and interconnecting logic, such as that as described in other of the various embodiments of the present invention. Each of the fixed logic block arrangements may be viewed as being a quantized design having fixed logic functionality.

The programmable logic fabric 310 is divided into a number of sectors. The particular division shown in the Figure has "n" sectors. Each of the "n" number of sectors contains a fixed logic block arrangement as shown by the fixed logic block arrangements 330, 340, 350, 360, 370, . . . and 390. While the particular embodiment of FIG. 3 does not have perfect n-sided symmetry, partial n-sided symmetry is provided. In such case, some but not all of the n sectors are fully symmetric with one another. However, not all of the n-sectors will be fully symmetric. Consider sectors corresponding to fixed logic block arrangements 330 and 360 (as well as fixed logic block arrangements 370 and 390). The size of these sectors is approximately equal and their shapes are symmetric. Should the fixed logic block arrangements 330, 360, 370, and 390 have appropriate symmetry, then the corresponding sectors would be perfectly, or nearly symmetric. However, if the fixed logic block arrangements 330, 360, 370, and 390 of these sectors are non-symmetric, although the shapes of these sectors present symmetry, overall, they are not symmetric.

Similar to the embodiments described in FIGS. 1 and 2, some of the n sectors of the integrated circuit 300 may communicate with one another. Some of the n sectors may share processing duties with other sectors. Furthermore, some of the sectors may operate as providing fail-safe back-up support for other sectors. When providing fail-safe back-up support, the two or more sectors will typically include similar logic block arrangements. For example, the sectors may even be duplicates of one another in terms of components and functionality. However, they may also be different as desired in a given application.

With the embodiment of FIG. 3, an arbiter 399 may also be employed to assist in priority disputes when two or more of the sectors within the integrated circuit 300 operate cooperatively. This arbiter may be implemented in hardware, software, or a combination of hardware and software. Furthermore, the arbiter 399 implementation may be distributed across the integrated circuit 300. The arbiter 399 of FIG. 3 is shown to reside so that it directly couples to each of the n sectors. While the arbiter 399 may have this physical construction, it may be located within one or more, but not all, of the n sectors and still serve as arbiter for all n sectors of the integrated circuit 300.

Figure 4:
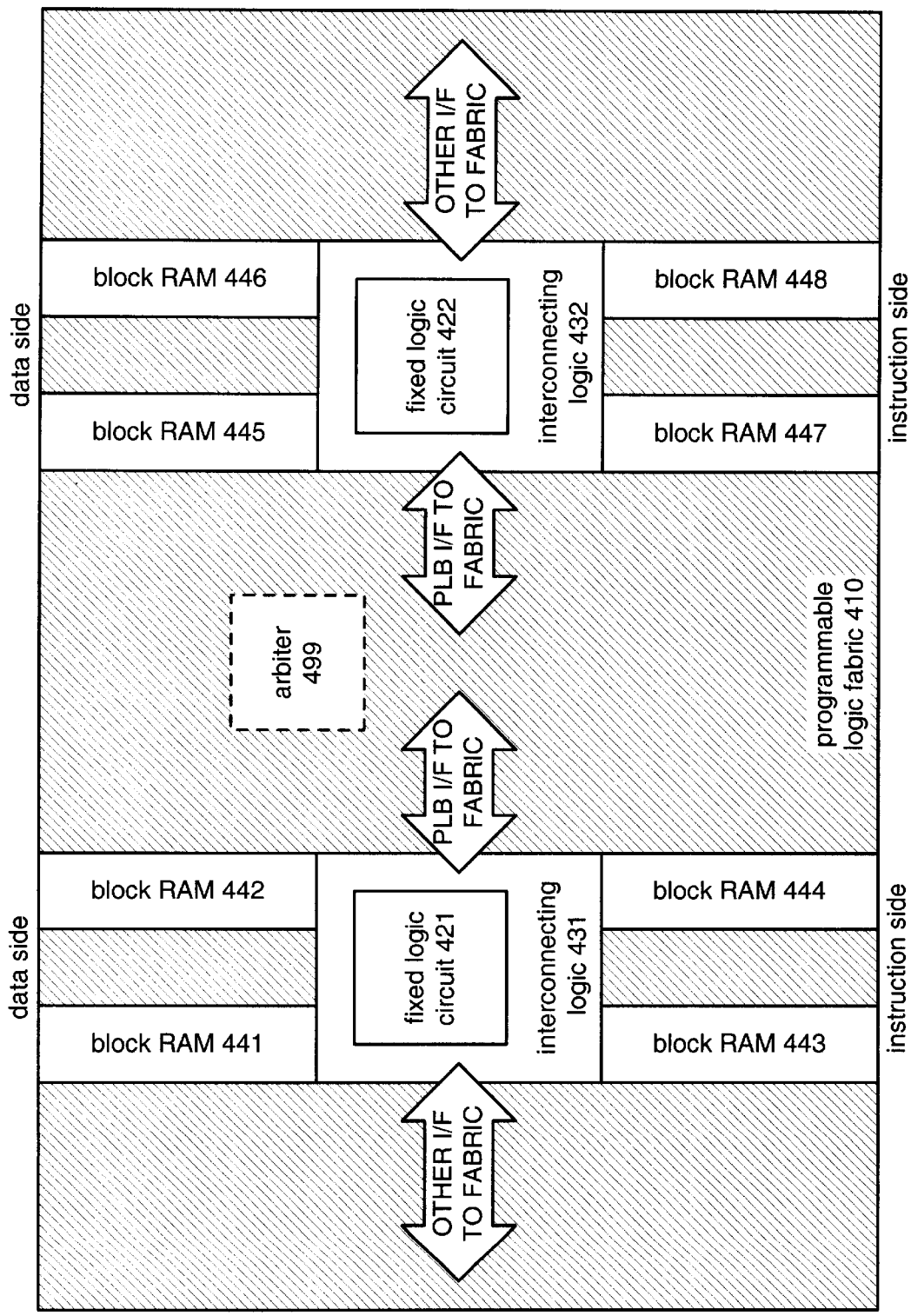
FIG. 4 is a system diagram illustrating another embodiment of an integrated circuit, having bilateral symmetry that is built in accordance with the present invention.

FIG. 4 is a system diagram illustrating another embodiment of an integrated circuit 400, having bilateral symmetry that is built in accordance with the present invention. The integrated circuit 400 includes a programmable logic fabric 410 that is surrounded by a programmable I/O (not shown explicitly in FIG. 4). In addition, the integrated circuit 400 includes two fixed logic block arrangements, each of which includes a fixed logic circuit and interconnecting logic. Located within the left hand side of the programmable logic fabric 410 is fixed logic circuit 421 that is surrounded by interfacing logic 431 and located within the right hand side of the programmable logic fabric 410 is fixed logic circuit 422 that is surrounded by interfacing logic 432. Each of the interconnecting logic 431 and 432 connects its respective fixed logic circuit, 421 and 422, to the programmable logic fabric 410.

The bilateral symmetry of the integrated circuit 400 of FIG. 4 relates to the manner in which the fixed logic block arrangements are located within, and interface with the programmable logic fabric 410. Bilateral symmetry of the integrated circuit 400 of FIG. 4 is generally about a center-line of the fabric 410. The fixed logic blocks 421 and 422 and the interfacing logic 431 and 432 themselves, however, may not be symmetric about the centerline of the fabric 410. In one particular embodiment described further herein with reference to FIGS. 6, 7, and 8, a fixed logic processor serves as the fixed logic circuit and resides within the programmable logic fabric 410. In the particular described embodiment, the fixed logic processors themselves are formed using a single set of masks and are not symmetric about the centerline of the fabric. However, in other embodiments, other fixed logic blocks could be constructed in a symmetrical manner about a line of symmetry as well.

The interconnecting logic 431 and 432 communicatively couples to block RAM, shown as block RAM 441, 442, 443, and 444, which serves as On Chip Memory (OCM) for the fixed logic circuits 421 and 422. Thus, interconnecting logic 431 serves to couple fixed logic block 421 to block RAM 441, 442, 443, and 444. Further interconnecting logic 432 serves to couple fixed logic block 422 to block RAM 445, 446, 447, and 448. Block RAMs 441–448 perform dedicated storage functions for the fixed logic circuits 421 and 422, bordering fabric 410, and I/O located along the periphery of the programmable logic fabric 410. The structure of the block RAM 441–448 illustrated is only one structure available. With other structures, the block RAM may be located within other parts of the programmable logic fabric but still serve the fixed logic block arrangements. In this fashion, the interconnecting logic 431 and 432 would simply address the block RAM at its boundaries to access the block RAM.

In the particular illustrated embodiment, the fixed logic circuits 421 and 422 interface with the fabric 410 in a symmetrical manner. For example, in using the block RAM 441–448, the fixed logic circuits 421 and 422 employ upper portions of the block RAM 441, 442, 445, and 446 for data storage and employ lower portions of the block RAM 445, 446, 447, and 448 for instruction storage. Differently stated, the block RAM in the top portion of the programmable logic fabric 410 is dedicated to storing data (data side) and the block RAM in the bottom side of the programmable logic fabric 410 is dedicated to storing instructions (instruction side). The fixed logic circuit 421, via its respective interconnecting logic 431, uses block RAM 441–444 to store and access data and instructions in performing their desired processing. Likewise, the fixed logic circuit 422, via its interconnecting logic 431, uses block RAM 445–448 to store and access data and instructions in performing their desired processing.

In addition, each of the fixed logic circuits 421 and 422, via their respective interconnecting logic 431 and 432, at least partially symmetrically interfaces with the fabric 410 via a Processor Local Bus (PLB) and/or a serial bus. The PLB is unique to the PowerPC 405 or similar processors of IBM. With different fixed logic processors, input/output devices, etc., a differing bus structures may be employed. Thus, the description provided with respect to the PLB bus is a single example of how symmetry may be employed in interfacing a fixed logic circuit to the fabric 410.

In this particular embodiment, the interconnecting logic 431 and 432 interface PLB address, data, and control lines to the central portion of the fabric 410 residing between the fixed logic circuits 421 and 422. Further, the interconnecting logic 431 and 432 applies other fixed logic circuit 421 and 422 interfaces to outer portions of the fabric 410, such outer portions residing opposite the central portions of the fabric 410. The interconnecting logic 431 and 432 may route the PLB I/F and the other I/F to the programmable logic fabric 410 in a fully symmetric or partially symmetric fashion, depending upon the particular embodiment (about a line of symmetry extending from the top to bottom of the integrated circuit 400 at a center line.

In the embodiment of FIG. 4 the PLB I/F and the other I/F is shown to extend into the fabric 410. However, as will be further described with reference to FIGS. 6 to 8, the lines of the PLB bus are actually applied to interconnecting tiles that border the opening in which the fixed logic circuit and interconnecting logic are formed. These interconnecting tiles directly couple to CLBs of the programmable logic fabric 410. Thus, the arrows representing the PLB I/F to the programmable logic fabric 410 are shown primarily to illustrate the manner in which the signal lines of the fixed logic circuits 421 and 422 are symmetrically applied to the fabric by the interconnecting logic 431 and 432, respectively.

If desired, the two sides of the integrated circuit 400 may or may not communicate with one another. That is to say, the two sides may operate as being fail-safe back-ups of one another. The two sides may include similar logic block arrangements on both sides. For example, the two sides may even be duplicates of one another in terms of components and functionality. However, they may also be different as desired in a given application. In addition, in alternative embodiments, an arbiter 499 may be employed to assist in priority disputes and/or to distribute processing load when both sides of the integrated circuit 400 operate cooperatively.

The interconnecting logic 431 and 432 may include similar components and functionality as the interconnecting logic previously described. However, the interconnecting logic 431 and 432 may also include different functionality as desired for given applications. At a very minimum, the interconnecting logic 431 and 432 is operable to perform the interconnecting and interfacing between the fixed logic circuits 421 and 422 and the programmable logic fabric 410.

By symmetrically interfacing the fixed logic circuits 421 and 422 to the fabric 410, efficiencies in configuration and usage of the fabric 410 are realized. For example, with data side block RAM being located in the upper portion of the fabric 410, a single portion of the fabric 410 may be configured to service all data side block RAM 441, 442, 445, and 446. Likewise, with instruction side block RAM being located in the lower portion of the fabric 410, a single portion of the fabric 410 may be configured to service all instruction side block RAM 443, 444, 447, and 448. Moreover, with both fixed logic circuits 421 and 422 interfacing with a central portion of the fabric 410, a single portion of the fabric 410 may be configured to service both of the PLB interfaces.

Figure 5:
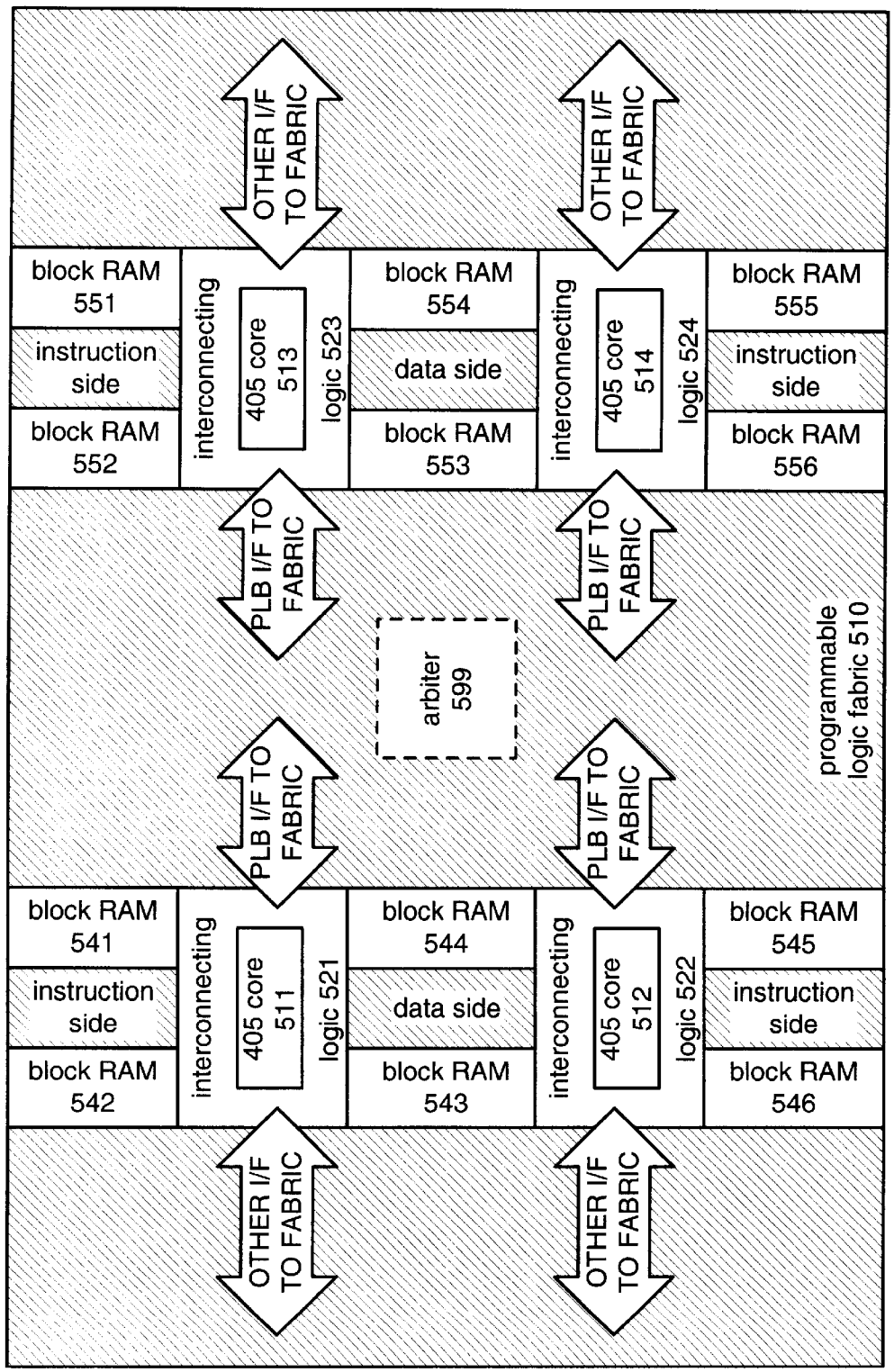
FIG. 5 is a system diagram illustrating an embodiment of an integrated circuit employing four microprocessors serving as fixed logic circuits within a programmable logic fabric that is built in accordance with the present invention.

FIG. 5 is a system diagram illustrating an embodiment of an integrated circuit employing four microprocessors serving as fixed logic circuits within a programmable logic fabric that is built in accordance with the present invention. The integrated circuit 500 of FIG. 5 includes four fixed logic block arrangements that reside within a programmable logic fabric 510 according to the present invention. Each of these fixed logic block arrangements includes a PowerPC 405 core ("405 core") surrounded by interconnecting logic. In particular, interconnecting logic 521, 522, 523, and 524 interfaces 405 cores 511, 512, 513, and 514, respectively, to the programmable logic fabric 510. Each of the 405 cores 511, 512, 513, and 514 is serviced by block RAM immediately above and below it within the programmable logic fabric 510. The block RAM serves as On Chip Memory (OCM) for the 405 cores 511, 512, 513, and 514. Each portion of the block RAM provides instruction, storage functions, data storage functions, or both instruction and data storage functions.

In the particular embodiment illustrated in FIG. 5, however, the block RAM is segregated to perform particular functions. For example, block RAM 543 and 544 services data storage for the 405 core 511 and the 405 core 512. Similarly, the block RAM 553 and 554 services data storage for the 405 core 513 and the 405 core 514. Block RAM near the outer portions of the programmable logic fabric 510 stores instructions for the 405 core 511, the 405 core 512, the 405 core 513, and the 405 core 514. For example, block RAM 541 and 542 stores instructions for the 405 core 511 and the block RAM 545 and 546 stores instructions for the 405 core 512. Similarly, block RAM 551 and 552 stores instructions for the 405 core 513 and the block RAM 555 and 556 store instructions for the 405 core 514. The 405 cores 511, 512, 513, and 514 execute the instructions stored in the block RAM 541, 542, 545, 546, 551, 552, 555, and 556 during startup/initialization and also during normal operations.

The 405 cores 511, 512, 513, and 514 interface with the programmable logic fabric 510 using their respective PLB I/Fs and other I/Fs. The interconnecting logic 521, 522, 523, and 524, interfaces the PLB I/Fs and other I/Fs to the programmable logic fabric 510. In this particular embodiment, the PLBs interface to the fabric 510 in a central region of the fabric 510 having the 405 core 511 and the 405 core 512 on a left side and the 405 core 513 and the 405 core 514 on right side. By having each of the PLBs interface to a central portion of the fabric 510, the fabric may be efficiently configured to include one or more functional components that communicate with the 405 cores 511, 512, 513, and 514 via their respective PLBs. The manner in which the PLBs interface to the programmable logic fabric 510 is therefore symmetric about lines of symmetry running from top to bottom and left to right of the integrated circuit and extending through a center point of the integrated circuit 500. The manner in which the other I/Fs interface to the programmable logic fabric 510 is symmetric in this same or a similar fashion. One variation of the structure of FIG. 5 that would retain symmetry include, for example, having the instruction side RAM reside between the 405 cores instead of on the outside portions of the 405 cores would also result in a symmetrical structure. The reader will appreciate that many variations may be made to the structure of FIG. 5 that will result in partial or full symmetry.

Figure 7:
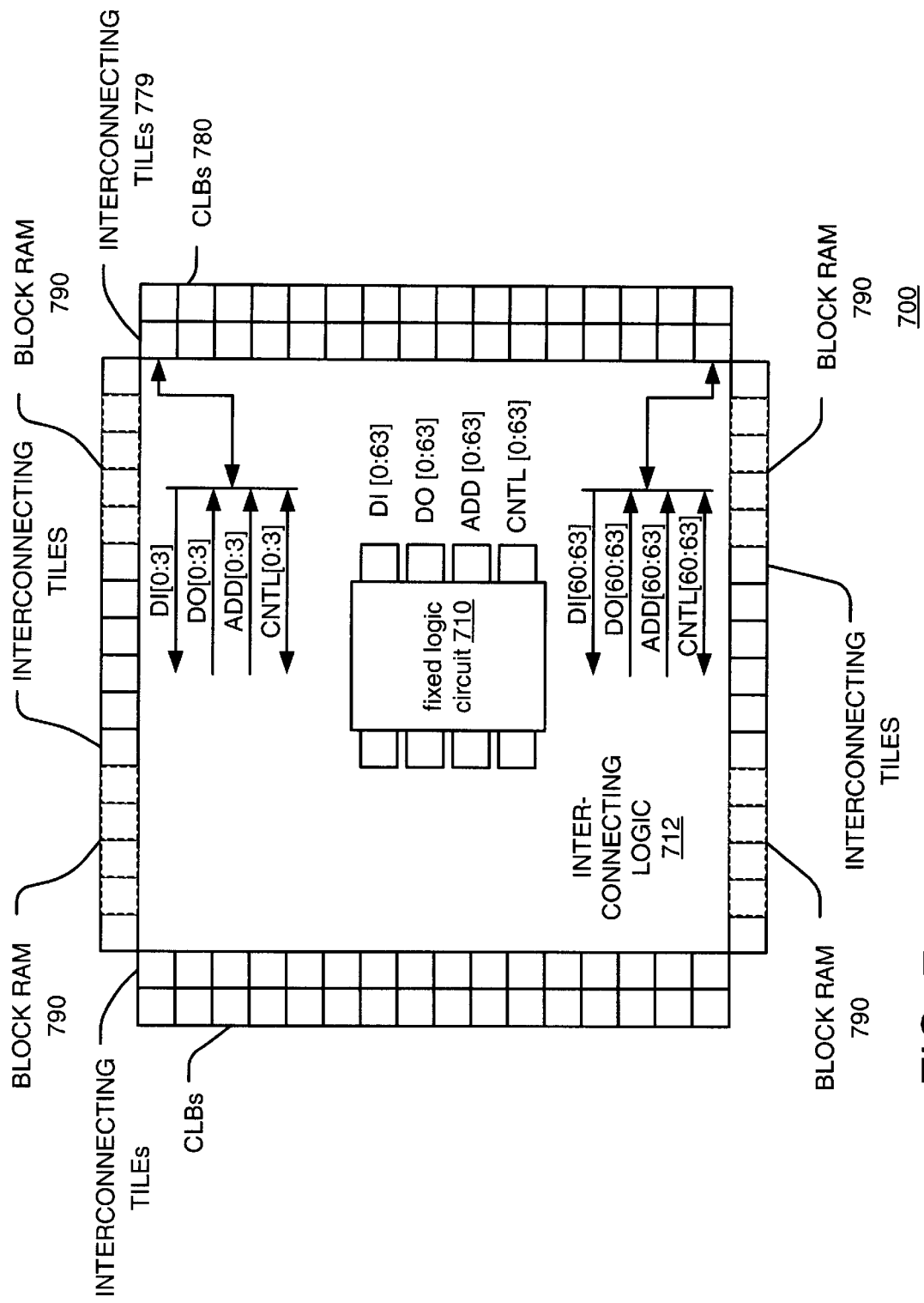
FIG. 7 is a partial system diagram illustrating the manner in which a plurality of signal lines of a processor local bus of a fixed logic circuit are interfaced to a plurality of interconnecting tiles/configurable logic blocks bordering a side of an opening in a fabric according to the present invention.
Figure 8:
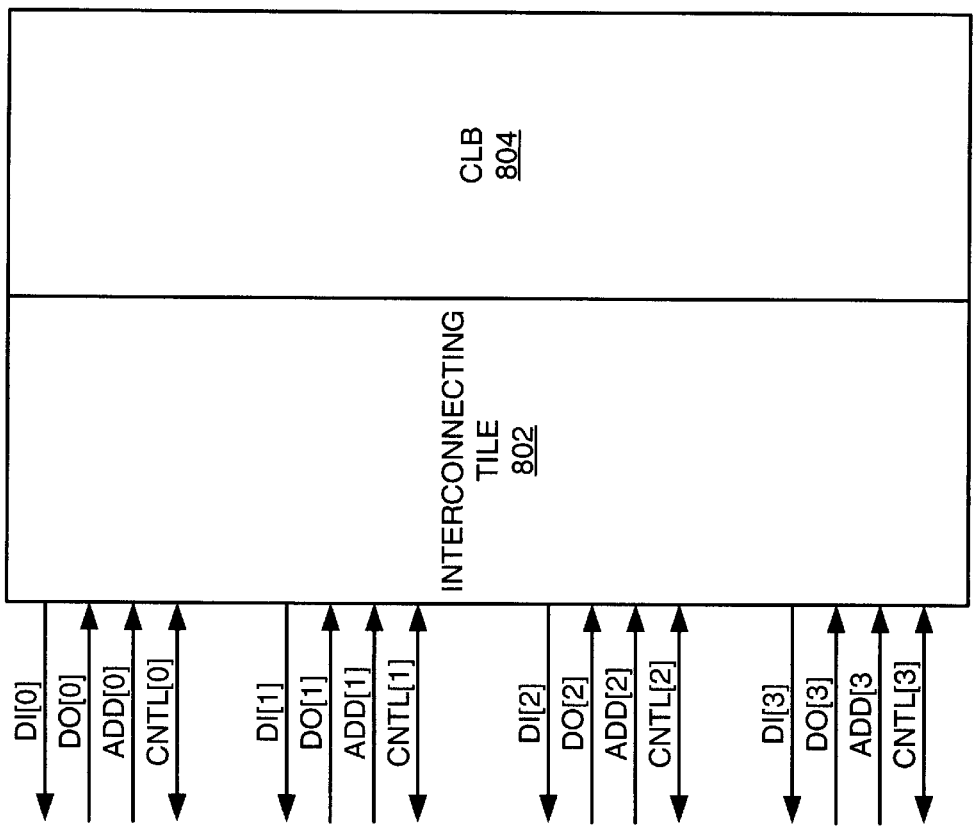
FIG. 8 is a block diagram illustrating one manner in which a plurality of signal lines of a processor local bus of a fixed logic circuit are interfaced to an interconnecting tile/configurable logic block bordering an opening in a fabric according to the present invention.

However, the presented symmetry may only be partial. With full, or near full symmetry, the manner in which the signal lines of the PLB I/Fs and/or the other I/Fs intercouple to the fabric would require a top-to-bottom reordering of the signal lines. This signal line reordering, while leading to a more symmetric interface, can make the interfacing more difficult. By having a same ordering of PLB signal lines in both the upper and lower PLB I/Fs, efficiencies can be gained in using a same interconnecting tile design for each of the fixed logic block arrangements. Furthermore, there may be an inherent uni-directionality of some resources in the programmable fabric which makes certain ordering of signals more efficient. For example, the carry-chain in Xilinx Virtex FPGA runs from top to bottom. If a bus on the fixed logic blocks is targeted to be connected to the carry chain, it is more appropriate if it follows the same ordering on every fixed logic block. Thus, in the illustrated embodiment, while full symmetry exists at a higher level, at the signal connection level, only partial symmetry exists. The description of FIGS. 6, 7, and 8 provides more detail in the manner in which lines of the fixed logic circuits are interfaced to the programmable logic fabric.

If desired, the two sides (or four quadrants) of the integrated circuit 500 may or may not communicate with one another. That is to say, the two sides (or four quadrants) may operate as being fail-safe back-ups of one another. The two sides (or four quadrants) may include similar logic block arrangements on both (all four) sides. For example, the two sides (or four quadrants) may even be duplicates of one another in terms of components and functionality. However, they may also be different as desired in a given application. In any case, an arbiter 599 may be employed to assist in priority disputes when both sides of the integrated circuit 500 operate cooperatively.

Figure 6:
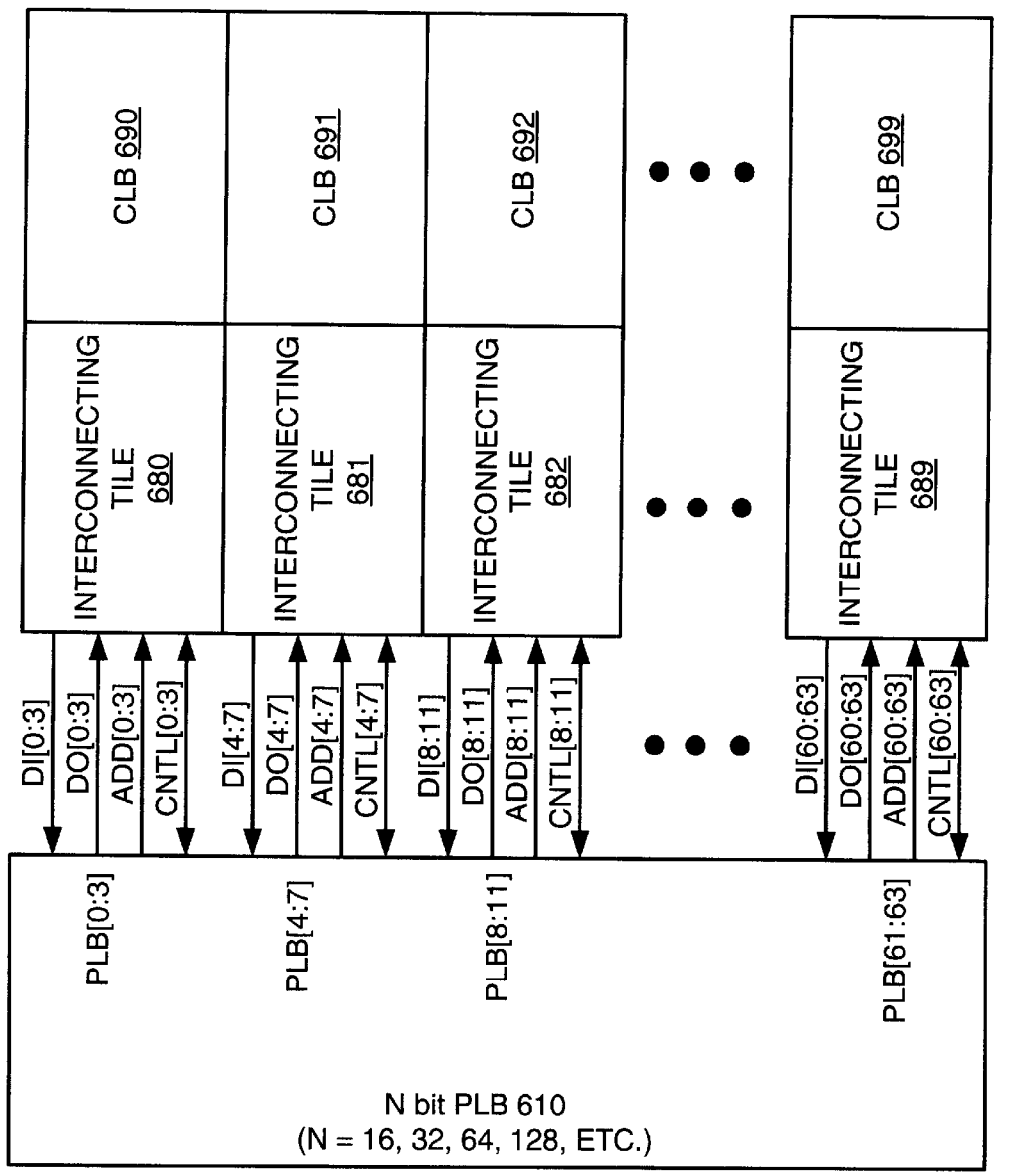
FIG. 6 is a block diagram illustrating the manner in which a plurality of signal lines of a processor local bus of a fixed logic circuit are interfaced to a plurality of interconnecting tiles/configurable logic blocks bordering an opening in a fabric according to the present invention.

FIG. 6 is a block diagram illustrating the manner in which a plurality of signal lines of a processor local bus of a fixed logic circuit are interfaced to a plurality of interconnecting tiles/configurable logic blocks bordering an opening in a fabric according to the present invention. In particular, a PLB 610 of a 405 core is described. The PLB 610 includes a plurality of components, each of which is N bits wide, e.g., 128 bits, 64 bits, 32 bits, etc. In particular, the PLB 610 includes Data Input lines (DI), Data Output lines (DO), Address Lines (ADD), and Control Lines (CNTL). In the embodiment illustrated, each of the DI, DO, ADD, and CNTL components of the PLB 610 is 64 bits in width. However, in other embodiments, these components are of differing widths. For example, in one particular embodiment, the DI and DO are 64 bits in width, the ADD is 32 bits in width, and the CNTL is 32 bits in width.

The interconnecting logic routes the signal lines of the PLB to interconnecting tiles 680, 681, 682, . . . , 689, that line an opening formed in the programmable logic fabric 510 to receive the fixed logic block arrangement that includes the respective 405 core. The 405 core communicates with the programmable logic fabric via the DI, DO, ADD, and CNTL of the PLB. The interconnecting logic couples the DI, DO, ADD, and CNTL to the interconnecting tiles 680-689. The interconnecting tiles 680–689 intercouple with CLBs 690–699. Because the interconnecting tiles 680–689 are specialized CLBS, the interconnecting tiles 680–689 may be viewed either as part of the interconnecting logic or part of the programmable fabric. In either case, their function is to interface the PLB of the 405 core to the CLBs of the programmable fabric.

Some aspects of the present invention also address the manner in which the signal lines of the PLB interface with the interconnecting tiles 680–689 and the CLBs 690–699. In one particular embodiment that will be described further with reference to FIG. 7, the signal lines of the PLB couple via the interconnecting logic only to interconnecting tiles/CLBs bordering a single side of the opening, e.g., the embodiments shown in FIGS. 4 and 5. However, in other embodiments, the signal lines of the PLB are distributed to CLBs residing on more than one side of the opening.

As illustrated in FIG. 6, the signal lines of the PLB, i.e., DI, DO, ADD, and CNTL are distributed along the interconnecting tiles/CLBs that service the PLB. For example, the first four signal lines [0:3] of each of DI, DO, ADD, and CNTL are serviced by interconnecting tile 680 while the last four signal lines [60:63] of each of DI, DO, ADD, and CNTL are serviced by interconnecting tile 689. This distributed signal interface design provides better routing of signals through the programmable fabric and also allows a relatively small number of CLBs to service all communication needs of the 405 core. In one particular application of this structure, the 405 core includes 941 signal lines. By distributing these signal lines to the CLBs of the programmable logic fabric bordering the opening in which the 405 core and interconnecting logic reside, each of the 941 lines is serviced by the programmable logic fabric in a satisfactory manner.

FIG. 7 is a partial system diagram illustrating the manner in which a plurality of signal lines of a processor local bus of a fixed logic circuit are interfaced to a plurality of interconnecting tiles/configurable logic blocks bordering a side of an opening in a fabric according to the present invention. The integrated circuit 700 is similar in structure to that of FIG. 6. An opening is formed within the programmable logic fabric that receives the fixed logic block arrangement that includes a fixed logic circuit 710 and interconnecting logic 712. The interconnecting logic 712 may include a plurality of interconnecting tiles that interface with CLBs 780 of the programmable logic fabric. However, as was previously described, the interconnecting tiles may be viewed as being part of the programmable logic fabric itself because the interconnecting tiles are specialized CLBs.

FIG. 7 illustrates a particular opening size that was selected to receive the fixed logic circuit 710 (405 core) and the interconnecting logic 712, i.e., 16 by 16 CLBs. In the structure of FIG. 7, the 64 bit width PLB is interfaced to a single side of the programmable logic fabric. Shown in FIG. 7 is the manner in which a 64 bit PLB I/F including signal lines DI[0:63], DO[0:63], ADD[0:63], and CNTL[0:63] is interfaced to the programmable logic fabric. The signal lines of these buses are distributed along the 16 interconnecting tiles 779 and 16 CLBs 780 that border the right side of the opening formed in the programmable logic. This distribution of the PLB lines across the 16 CLBs bordering the opening allows this relatively small number of CLBs to service the four buses, each of which is 64 bits in width. As is shown, a first interconnecting tile along the right side of the opening receives signals DI[0:3], DO[0:3], ADD[0:3], and CNTL[0:3]. As is also shown, a last interconnecting tile along the right side of the opening receives signals DI[60:63], DO[60:63], ADD[60:63], and CNTL[60:63]. The remaining signal lines of the PLB are distributed along the other 14 interconnecting tiles bordering the right side of the opening.

As will be understood by the reader, when differing numbers of signal lines are serviced, the distribution of the signal lines will be different. For example should each of DI, DO, ADD, and CNTL have only 32 signal lines each, one distribution of signal lines would cause each of the interconnecting tiles to service 2 signal lines of each of DI, DO, ADD, and CNTL. Alternately, a smaller opening could be formed (assuming a smaller area would service the fixed logic circuit 710 and interconnecting logic 712). For example, if each of DI, DO, ADD, and CNTL included 32 signal lines, 8 interconnecting tiles could service the 32 signal lines in a similar fashion as that illustrated. In such case, each of the 8 interconnecting tiles would service four signal lines of DI, DO, ADD, and CNTL.

FIG. 8 is a block diagram illustrating one manner in which a plurality of signal lines of a processor local bus of a fixed logic circuit are interfaced to an interconnecting tile/configurable logic block bordering an opening in a fabric according to the present invention. In FIG. 8, an interconnecting tile 802 receives DI[0:3], DO[0:3], ADD[0:3], and CNTL[0:3]. The interconnecting tile couples to CLB 804. However, as will be understood, the interconnecting tile 802 may also communicatively couple to diagonally located CLBs. In this particular embodiment, Each of the signal lines DI[0:3], DO[0:3], ADD[0:3], and CNTL[0:3] are distributed along the interconnecting tile.

Figure 9:
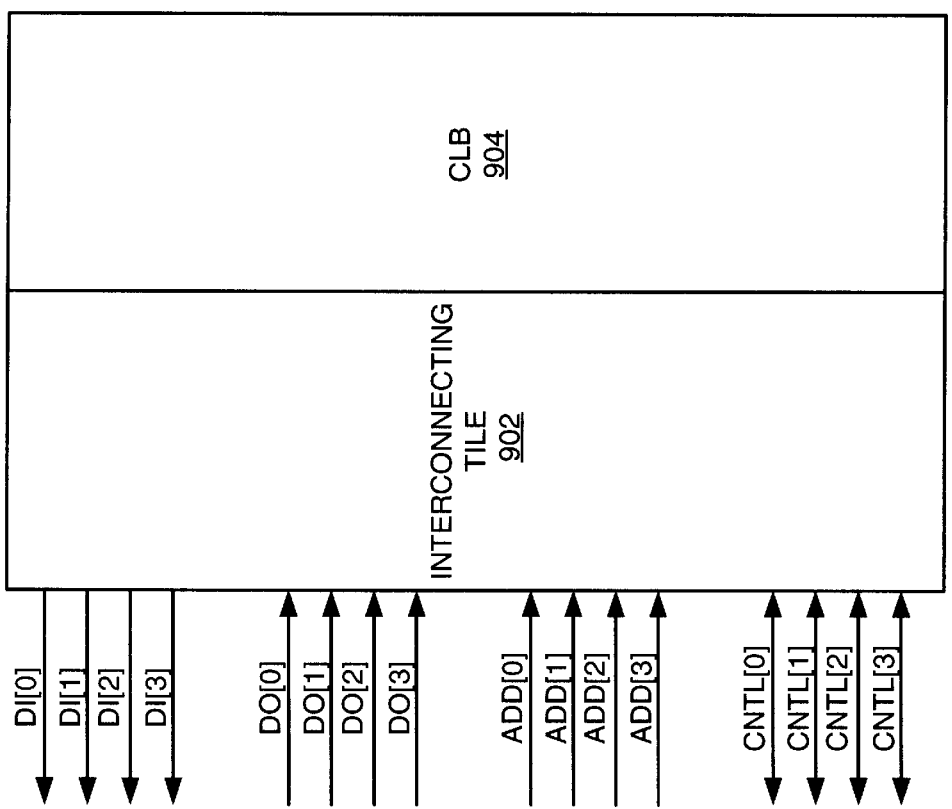
FIG. 9 is a block diagram illustrating another manner in which a plurality of signal lines of a processor local bus of a fixed logic circuit are interfaced to an interconnecting tile/configurable logic block bordering an opening in a fabric according to the present invention

FIG. 9 is a block diagram illustrating another manner in which a plurality of signal lines of a processor local bus of a fixed logic circuit are interfaced to an interconnecting tile/configurable logic block bordering an opening in a fabric according to the present invention. As contrasted to the structure illustrated in FIG. 8, with the structure of FIG. 9, the signals DI[0:3], DO[0:3], ADD[0:3], and CNTL[0:3] are grouped in their connectivity along the interconnecting tile 902. However, the interconnecting tile 902 couples to CLB 904 in the same manner as interconnecting tile 802 couples to CLB 804.

In view of the above detailed description of the invention and associated drawings, other modifications and variations will now become apparent to those skilled in the art. It should also be apparent that such other modifications and variations may be effected without departing from the spirit and scope of the invention.

What is claimed is:

1. An integrated circuit comprising:

a plurality of configurable logic blocks arranged into a fabric, the fabric having an opening therein that is surrounded by configurable logic blocks;

a fixed logic circuit residing in the opening, wherein the fixed logic circuit includes a plurality of input/output lines;

interconnecting logic residing in the opening that interfaces the plurality of input/output lines to the fabric; and wherein the interconnecting logic distributes the plurality of input/output lines along a plurality of configurable logic blocks bordering the opening.

2. The integrated circuit of claim 1, wherein:

the input/output lines include address lines and data lines; and each of the plurality of configurable logic blocks services at least one address line and at least one data line of the plurality of input/output lines.

3. The integrated circuit of claim 1, wherein:

the input/output lines include address lines, data lines, and control lines; and each of the plurality of configurable logic blocks services at least one address line, at least one data line, and at least one control line of the plurality of input/output lines.

4. The integrated circuit of claim 1, wherein:

the input/output lines include address lines, data in lines, data out lines, and control lines; and each of the plurality of configurable logic blocks services at least one address line, at least one data in line, at least one data out line, and at least one control line of the plurality of input/output lines.

5. The integrated circuit of claim 1, wherein each of the plurality of the configurable logic blocks surrounding the opening services a plurality of address lines and a plurality of data lines of the plurality of input/output lines.

6. The integrated circuit of claim 1, wherein the plurality of the configurable logic blocks define a first side of the opening and service a plurality of address lines and a plurality of data lines of the plurality of input/output lines.

7. An integrated circuit comprising:

a plurality of configurable logic blocks arranged into a fabric, the fabric having an opening therein that is surrounded by configurable logic blocks;

a fixed logic circuit residing in the opening, wherein the fixed logic circuit includes a plurality of input/output lines;

interconnecting logic residing in the opening that interfaces the plurality of input/output lines to the fabric; and wherein the interconnecting logic distributes the plurality of input/output lines along a plurality of configurable logic blocks bordering a first side of the opening.

8. The integrated circuit of claim 7, wherein:

the input/output lines include address lines, data lines, and control lines; and each of the plurality of configurable logic blocks services at least one address line, at least one data line, and at least one control line of the plurality of input/output lines.

9. The integrated circuit of claim 7, wherein:

the input/output lines include address lines, data in lines, data out lines, and control lines; and each of the plurality of configurable logic blocks services at least one address line, at least one data in line, at least one data out line, and at least one control line of the plurality of input/output lines.

10. An integrated circuit comprising:

a plurality of configurable logic blocks arranged into a fabric, the fabric having a first opening and a second opening formed therein, each of which is surrounded by configurable logic blocks;

a first fixed logic circuit residing in the first opening, wherein the first fixed logic circuit includes a first plurality of input/output lines;

a second fixed logic circuit residing in the second opening, wherein the second fixed logic circuit includes a second plurality of input/output lines;

first interconnecting logic residing in the first opening that interfaces the first plurality of input/output lines to the fabric;

second interconnecting logic residing in the second opening that interfaces the second plurality of input/output lines to the fabric; and wherein the first interconnecting logic and the second interconnecting logic symmetrically interface the first plurality of input/output lines and the second plurality of input/output lines to the fabric.

11. The integrated circuit of claim 10, wherein:

the first opening resides in a first side of the fabric;
the second opening resides in a second side of the fabric;
the first side of the fabric and the second side of the fabric are divided by a center line of the fabric; and
the first plurality of input/output lines and the second plurality of input/output lines are symmetrically interfaced to the fabric about the center line of the fabric.

12. The integrated circuit of claim 10, wherein:

the fabric includes block RAM arranged into a plurality of block RAM strips;
the first opening bisects a first block RAM strip into an upper portion and a lower portion;
the second opening bisects a second block RAM strip into an upper portion and a lower portion;
the upper portions of the first and second block RAM strips are employed for instruction storage by the first and second fixed logic circuits, respectively; and
the lower portions of the first and second block RAM strips are employed for data storage by the first and second fixed logic circuits, respectively.

13. The integrated circuit of claim 10, wherein:

the fabric includes block RAM arranged into a plurality of block RAM strips;
the first opening bisects a first block RAM strip into an upper portion and a lower portion;
the second opening bisects a second block RAM strip into an upper portion and a lower portion;
the upper portions of the first and second block RAM strips are employed for data storage by the first and second fixed logic circuits, respectively; and
the lower portions of the first and second block RAM strips are employed for instruction storage by the first and second fixed logic circuits, respectively.

14. The integrated circuit of claim 10, wherein:

the fabric includes block RAM arranged into a plurality of block RAM strips;
the first opening bisects a first set of block RAM strips into an upper portion and a lower portion;
the second opening bisects a second set of block RAM strips into an upper portion and a lower portion;
the upper portions of the first and second sets of block RAM strips are employed for instruction storage by the first and second fixed logic circuits, respectively; and
the lower portions of the first and second sets of block RAM strips are employed for data storage by the first and second fixed logic circuits, respectively.

15. The integrated circuit of claim 10, wherein:

the fabric includes block RAM arranged into a plurality of block RAM strips;
the first opening bisects a first set of block RAM strips into an upper portion and a lower portion;
the second opening bisects a second set of block RAM strips into an upper portion and a lower portion;
the upper portions of the first and second sets of block RAM strips are employed for data storage by the first and second fixed logic circuits, respectively; and
the lower portions of the first and second sets of block RAM strips are employed for instruction storage by the first and second fixed logic circuits, respectively.

16. The integrated circuit of claim 10, wherein the first fixed logic circuit and the second fixed logic circuit comprise substantially identical circuits.

17. The integrated circuit of claim 10, wherein:

the first opening resides in a first side of the fabric;
the second opening resides in a second side of the fabric;
the first side of the fabric and the second side of the fabric are divided by a center line of the fabric; and
the first plurality of input/output lines and the second plurality of input/output lines extend from the first fixed logic circuit and the second fixed logic circuit symmetrically about the center line of the fabric.

18. An integrated circuit comprising:

a plurality of configurable logic blocks arranged into a fabric, the fabric having a first opening, a second opening, a third opening, and a fourth opening formed therein, each of which is surrounded by configurable logic blocks;

a first fixed logic circuit residing in the first opening, wherein the first fixed logic circuit includes a first plurality of input/output lines;

a second fixed logic circuit residing in the second opening, wherein the second fixed logic circuit includes a second plurality of input/output lines;

first interconnecting logic residing in the first opening that interfaces the first plurality of input/output lines to the fabric;

second interconnecting logic residing in the second opening that interfaces the second plurality of input/output lines to the fabric; and wherein the first interconnecting logic and the second interconnecting logic symmetrically interface the first plurality of input/output lines and the second plurality of input/output lines to the fabric.

19. The integrated circuit of claim 18, further comprising:

a third fixed logic circuit residing in the third opening, wherein the third fixed logic circuit includes a third plurality of input/output lines;

a fourth fixed logic circuit residing in the fourth opening, wherein the fourth fixed logic circuit includes a fourth plurality of input/output lines;

third interconnecting logic residing in the third opening that interfaces the third plurality of input/output lines to the fabric;

fourth interconnecting logic residing in the fourth opening that interfaces the fourth plurality of input/output lines to the fabric; and wherein the third interconnecting logic and the fourth interconnecting logic symmetrically interface the third plurality of input/output lines and the fourth plurality of input/output lines to the fabric.

20. The integrated circuit of claim 19, wherein:

the fabric includes four quadrants;

the first fixed logic circuit and the second fixed logic circuit reside in lower quadrants of the four quadrants; and the third fixed logic circuit and the fourth fixed logic circuit reside in upper quadrants of the four quadrants.

21. The integrated circuit of claim 19, wherein:

the fabric includes four quadrants;

the first fixed logic circuit and the second fixed logic circuit reside in right quadrants of the four quadrants; and the third fixed logic circuit and the fourth fixed logic circuit reside in left quadrants of the four quadrants.

22. The integrated circuit of claim 19, wherein:

the fabric includes block RAM arranged into a plurality of block RAM strips;

the first opening bisects a first block RAM strip into an upper portion and a central portion;

the second opening bisects a second block RAM strip into an upper portion and a central portion;

the third opening bisects the first block RAM strip into the central portion and a lower portion;

the fourth opening bisects the second block RAM strip into the central portion and a lower portion;

the upper portions of the block RAM strips are employed for instruction storage by the first and second fixed logic circuits; and the lower portions of the first and second block RAM strips are employed for instruction storage by the third and fourth fixed logic circuits, respectively.

23. The integrated circuit of claim 22, wherein:

the central portion of the first block RAM strip is employed for data storage by the first and second fixed logic circuits; and the central portion of the second block RAM strip is employed for data storage by the third and fourth fixed logic circuits.

24. A method for designing an integrated circuit, the method comprising:

arranging a plurality of configurable logic blocks into a fabric;

removing a group of the configurable logic blocks from the fabric to form an opening in the fabric that is surrounded by configurable logic blocks;

placing a fixed logic circuit in the opening, wherein the fixed logic circuit includes a plurality of input/output lines;

placing interconnecting logic in the opening that interfaces the plurality of input/output lines to the fabric; and wherein the interconnecting logic distributes the plurality of input/output lines along a plurality of configurable logic blocks bordering of the opening.

25. The method of claim 24, wherein:

the input/output lines include address lines and data lines; and the interfacing circuit causes each of the plurality of the configurable logic blocks to service at least one address line and at least one data line of the plurality of input/output lines.

26. The method of claim 24, wherein:

the input/output lines include address lines, data lines, and control lines; and wherein each of the plurality of the configurable logic blocks services at least one address line, at least one data line, and at least one control line of the plurality of input/output lines.

27. The method of claim 24, wherein:

the input/output lines include address lines, data in lines, data out lines, and control lines; and each of the plurality of the configurable logic blocks services at least one address line, at least one data in line, at least one data out line, and at least one control line of the plurality of input/output lines.

28. The method of claim 24, wherein each of the plurality of the configurable logic blocks surrounding the opening services a plurality of address lines and a plurality of data lines of the plurality of input/output lines.

29. The method of claim 24, wherein the plurality of the configurable logic blocks define a first side of the opening and service a plurality of address lines and a plurality of data lines of the plurality of input/output lines.

30. A method for designing an integrated circuit, the method comprising:

arranging a plurality of configurable logic blocks into a fabric;

removing a group of the configurable logic blocks from the fabric to form an opening in the fabric that is surrounded by configurable logic blocks;

placing a fixed logic circuit in the opening, wherein the fixed logic circuit includes a plurality of input/output lines;

placing interconnecting logic residing in the opening that interfaces the plurality of input/output lines to the fabric; and wherein the interconnecting logic distributes the plurality of input/output lines along a plurality of configurable logic blocks forming a first side of the opening.

31. The method of claim 30, wherein:

the input/output lines include address lines, data lines, and control lines; and each of the plurality of configurable logic blocks services at least one address line, at least one data line, and at least one control line of the plurality of input/output lines.

32. The method of claim 30, wherein:

the input/output lines include address lines, data in lines, data out lines, and control lines; and each of the plurality of configurable logic blocks services at least one address line, at least one data in line, at least one data out line, and at least one control line of the plurality of input/output lines.

33. A method for designing an integrated circuit, the method comprising:

arranging a plurality of configurable logic blocks into a fabric;

removing a first group of the configurable logic blocks to form a first opening in the fabric that is surrounded by configurable logic blocks;

removing a second group of the configurable logic blocks to form a second opening in the fabric that is surrounded by configurable logic blocks;

placing a first fixed logic circuit in the first opening, wherein the first fixed logic circuit includes a first plurality of input/output lines;

placing a second fixed logic circuit in the second opening, wherein the second fixed logic circuit includes a second plurality of input/output lines;

placing first interconnecting logic in the first opening that interfaces the first plurality of input/output lines to the fabric;

placing second interconnecting logic in the second opening that interfaces the second plurality of input/output lines to the fabric; and wherein the first interconnecting logic and the second interconnecting logic symmetrically interface the first plurality of input/output lines and the second plurality of input/output lines to the fabric.

34. The method of claim 33, wherein:

the first opening resides in a first side of the fabric;

the second opening resides in a second side of the fabric;

the first side of the fabric and the second side of the fabric are divided by a center line of the fabric; and the first plurality of input/output lines and the second plurality of input/output lines are symmetrically interfaced to the fabric about the center line of the fabric.

35. The method of claim 33, further comprising forming a plurality of block RAM strips in the fabric, wherein:

the first opening bisects a first block RAM strip into an upper portion and a lower portion;

the second opening bisects a second block RAM strip into an upper portion and a lower portion;

the upper portions of the first and second block RAM strips are employed for instruction storage by the first and second fixed logic circuits, respectively; and the lower portions of the first and second block RAM strips are employed for data storage by the first and second fixed logic circuits, respectively.

36. The method of claim 35, wherein the first fixed logic circuit and the second fixed logic circuit comprise substantially identical circuits.

37. The method of claim 33, wherein:

the first opening resides in a first side of the fabric;

the second opening resides in a second side of the fabric;

the first side of the fabric and the second side of the fabric are divided by a center line of the fabric; and the first plurality of input/output lines and the second plurality of input/output lines extend from the first fixed logic circuit and the second fixed logic circuit symmetrically about the center line of the fabric.

38. A method for designing integrated circuit, the method comprising:

arranging a plurality of configurable logic blocks arranged into a fabric;

removing four groups of configurable logic blocks from the fabric to form a first opening, a second opening, a third opening, and a fourth opening in the fabric, each opening being surrounded by configurable logic blocks;

placing a first fixed logic circuit in the first opening, wherein the first fixed logic circuit includes a first plurality of input/output lines;

placing a second fixed logic circuit in the second opening, wherein the second fixed logic circuit includes a second plurality of input/output lines;

placing first interconnecting logic in the first opening that interfaces the first plurality of input/output lines to the fabric;

placing second interconnecting logic in the second opening that interfaces the second plurality of input/output lines to the fabric; and wherein the first interconnecting logic and the second interconnecting logic symmetrically interface the first plurality of input/output lines and the second plurality of input/output lines to the fabric.

39. The method of claim 38, further comprising:

placing a third fixed logic circuit in the third opening, wherein the third fixed logic circuit includes a third plurality of input/output lines;

placing a fourth fixed logic circuit in the fourth opening, wherein the fourth fixed logic circuit includes a fourth plurality of input/output lines;

placing third interconnecting logic in the third opening that interfaces the third plurality of input/output lines to the fabric;

placing fourth interconnecting logic in the fourth opening that interfaces the fourth plurality of input/output lines to the fabric; and wherein the third interconnecting logic and the fourth interconnecting logic symmetrically interface the third plurality of input/output lines and the fourth plurality of input/output lines to the fabric.

40. The method of claim 39, wherein:

the fabric includes four quadrants;

the first fixed logic circuit and the second fixed logic circuit reside in lower quadrants of the four quadrants; and the third fixed logic circuit and the fourth fixed logic circuit reside in upper quadrants of the four quadrants.

41. The method of claim 39, wherein:

the fabric includes four quadrants;

the first fixed logic circuit and the second fixed logic circuit reside in right quadrants of the four quadrants; and the third fixed logic circuit and the fourth fixed logic circuit reside in left quadrants of the four quadrants.

42. The method of claim 39, wherein:

the fabric includes block RAM arranged into a plurality of block RAM strips;

the first opening bisects a first block RAM strip into an upper portion and a central portion;

the second opening bisects a second block RAM strip into an upper portion and a central portion;

the third opening bisects the first block RAM strip into the central portion and a lower portion;

the fourth opening bisects the second block RAM strip into the central portion and a lower portion;

the upper portions of the block RAM strips are employed for instruction storage by the first and second fixed logic circuits; and the lower portions of the first and second block RAM strips are employed for instruction storage by the third and fourth fixed logic circuits, respectively.

43. The method of claim 42, wherein:

the central portion of the first block RAM strip is employed for data storage by the first and second fixed logic circuits; and the central portion of the second block RAM strip is employed for data storage by the third and fourth fixed logic circuits.

* * * * *